(12) United States Patent
Numai (10) Patent No.: US 6,297,883 B1
(45) Date of Patent: Oct. 2, 2001

(54) RING LASER GAS GYRO WITH BEAT SIGNAL DETECTION FROM CURRENT, VOLTAGE, OR IMPEDANCE OF THE RING LASER

(75) Inventor: Takahiro Numai, Ninomiya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/419,778

(22) Filed: Oct. 18, 1999

(30) Foreign Application Priority Data

Oct. 19, 1998 (JP) .................................................. 10-296580
Jul. 30, 1999 (JP) .................................................. 11-217190

(51) Int. Cl.[7] .................................................. G01C 19/66
(52) U.S. Cl. .................................................. 356/459
(58) Field of Search .................................. 356/459, 461; 372/94

(56) References Cited

U.S. PATENT DOCUMENTS

| | | | |
|---|---|---|---|
| 3,390,606 | * 7/1968 | Podgorski | 356/459 |
| 4,431,308 | 2/1984 | Mitsuhashi et al. | 356/459 |
| 4,913,548 | 4/1990 | Vick | 356/459 |

FOREIGN PATENT DOCUMENTS

| | | |
|---|---|---|
| 60-148185 | 8/1985 | (JP) . |
| 62-39836 | 5/1987 | (JP) . |
| 4-174317 | 6/1992 | (JP) . |
| 5-288556 | 11/1993 | (JP) . |
| 6-140364 | 5/1994 | (JP) . |
| 6-38529 | 5/1994 | (JP) . |
| 7-131123 | 5/1995 | (JP) . |
| 7-146150 | 6/1995 | (JP) . |
| 8-018166 | 1/1996 | (JP) . |
| 8-125251 | 5/1996 | (JP) . |

* cited by examiner

Primary Examiner—Samuel A. Turner
(74) Attorney, Agent, or Firm—Fitzpatrick, Cella, Harper & Scinto (57) ABSTRACT

An optical gyro reduces the coupling loss generated when laser beams are incident upon a photodetector and the noise generated by the reflected beams from an external point of reflection to the laser. The gyro includes a ring resonator type gas laser with laser beams propagating circuitally in opposite directions relative to each other and a beat signal detector for detecting a change in electric current, voltage or impedance.

10 Claims, 7 Drawing Sheets

RING LASER GAS GYRO WITH BEAT SIGNAL DETECTION FROM CURRENT, VOLTAGE, OR IMPEDANCE OF THE RING LASER

BACKGROUND OF THE INVENTION

1. Field of the Invention

This invention relates to a gas laser, which is in particular a ring resonator type gas laser. The present invention also relates to a gyro comprising a gas laser and a method of operating such a gyro. More particularly, the present invention relates to an optical gyro adapted to reduce the coupling loss generated when laser beams are incident upon a photodetector and the noise generated by the reflected beams reentering the laser from an external point of reflection as well as to a method of operating such an optical gyro.

2. Related Background Art

Mechanical gyros comprising a rotor and a vibrator as well as optical gyros adapted to detect the angular velocity of a moving object are known. Particularly, optical gyros are regarded as real innovation because they can start to operate instantaneously and provide a wide dynamic range. Optical gyros include ring resonator type laser gyros, optical fiber gyros and passive type ring resonator gyros, of which ring resonator type raser gyros comprising a gas laser were developed most early and have been used in aeronautic applications and other applications. Recently, small, high precision, ring resonator type laser gyros have been proposed and Japanese Patent Application Laid-Open No. 5-288556 described such a gyro.

However, known ring resonator type laser gyros are so designed that a laser beam propagating clockwise and another laser beam propagating counterclockwise are once emitted therefrom to the outside and received by a photodetector, which detects their optical beat and transforms it into an electric beat as a signal. This means that a coupling loss arises when the laser beams enter the photodetector. Additionally, known ring resonator type laser gyros need an optical isolator in order to avoid the noise generated by the beams reflected from an external point of reflection to the laser.

Particularly, since gas lasers are bulky and costly and consume driving electric power to a large extent, there is a strong demand for gyros comprising gas lasers that can be realized with a reduced number of components and hence at low cost and little power consumption.

SUMMARY OF THE INVENTION

Therefore, it is an object of the present invention to provide a gyro that is totally or almost totally free from the problem of coupling loss and that of noise due to reflected beams as well as a method of operating it.

According to the invention, the above object is achieved by providing a gyro comprising a ring resonator type gas laser with laser beams propagating circuitally in opposite directions relative to each other and a terminal for detecting a beat signal.

According to a first aspect of the invention, there is provided a gyro comprising a ring resonator type gas laser with laser beams propagating circuitally in opposite directions relative to each other, the gyro being adapted to detect a beat signal.

Preferably, the beat signal is detected as a change in the electric current flowing through, the voltage applied to, or the impedance of the ring resonator type laser.

Alternatively, the beat signal is detected as a frequency change of the electric current flowing through, the voltage applied to, or the impedance of the ring resonator type laser.

Preferably, the beat signal is taken out from the discharging electrodes of the ring resonator type gas laser.

According to a second aspect of the invention, there is provided a gyro comprising a ring resonator type gas laser with laser beams propagating circuitally in opposite directions relative to each other and a beat signal detecting meaps.

Preferably, the beatsignal detecting means includes a voltage detection circuit, an electric current detection circuit or an impedance detection circuit.

Alternatively, the beat signal detecting means includes a frequency/voltage converter.

Preferably, the electric current or the voltage for driving the ring resonator type gas laser is modulated in a frequency band, which is different from that of the frequency of the beat signal.

Alternatively, the beat signal is detected synchronously with a vibration, which is applied to the laser and has a frequency different from that of the beat signal.

According to a third aspect of the invention, there is provided a method of operating a gyro comprising a ring resonator type gas laser with laser beams propagating circuitally in opposite directions relative to each other and a terminal for detecting the beat signal produced therefrom as a change in electric current, voltage or impedance, the change in the electric current flowing through, the voltage applied to or the impedance being used as signal for determining the angular velocity of the ring resonator type laser.

DESCRIPTION OF THE PREFERRED EMBODIMENTS

Firstly, the principle underlying the operation of detecting the rotary motion of an object by means of a ring resonator type laser will be described.

Figure 1:
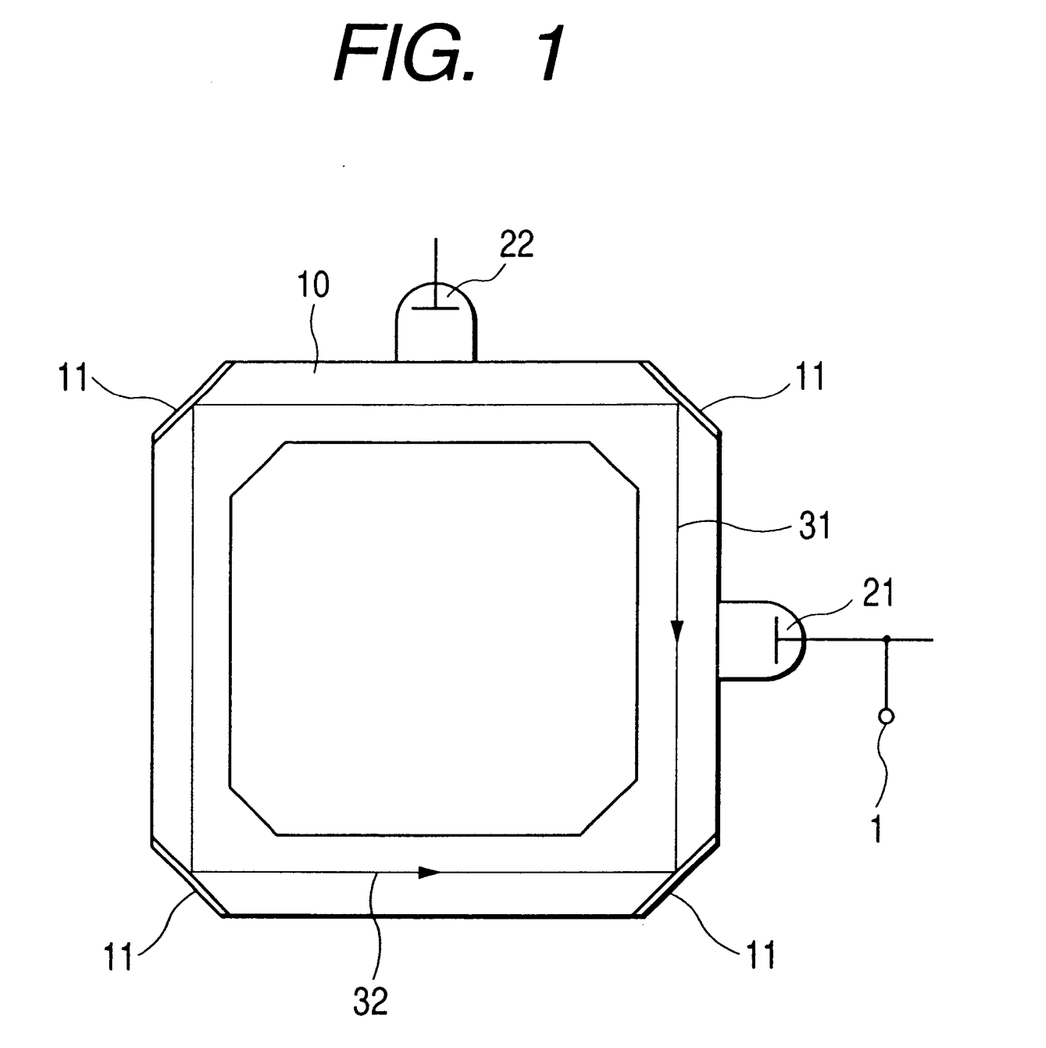
FIG. 1 is a schematic plan view of an embodiment of gyro according to the invention.

The laser beams that are generated in a ring resonator type laser propagate circuitally as shown in FIG. 1.

More specifically, there are a laser beam made to propagate clockwise and a laser beam made to propagate counterclockwise within the laser.

So long as the ring resonator type laser is held to a halted state, the laser beam propagating clockwise and the laser beam propagating counterclockwise have the same oscillation frequency.

However, when the laser is rotated in the plane where the laser beams exist, the laser beam propagating clockwise and the laser beam propagating counterclockwise give rise to a difference of oscillation frequency due to Sagnac effect. The difference of oscillation frequency $\Delta f$ is expressed by formula (1) below;

$$\Delta f = (4S/\lambda L)\, \Omega \qquad (1),$$

where S is the area of the closed domain surrounded by the optical path, $\lambda$ is the oscillation wavelength of the laser beams, L is the length of the optical path and $\Omega$ is the angular velocity of rotation. In a gas laser, the population inversion and the impedance of the gas laser show a 1 to 1 correspondence. When the laser beams interfere with each other in the laser, the population inversion is altered to consequently change the impedance between the electrodes of the laser. The change appears as the variation in the electric current flowing through the laser when a constant voltage source is used as drive power source. Then, a battery can be used for the constant voltage source to make the drive system downsized and lightweight. The change appears as the variation in the terminal voltage when a constant current source is used. Therefore, the interference of laser beams can be taken out as a signal in either case. Alternatively, the change in the impedance can be observed directly by means of an impedance meter. In this case, the influence of the driving power source noise can be minimized unlike the case of observing the terminal voltage or the electric current flowing to an element of the laser. Thus, according to the invention, by arranging a terminal for detecting the change in the electric current, the voltage, or the impedance that is caused by an interference of a pair of laser beams propagating in opposite directions, a beat signal representing the rotation can be taken out from the terminal.

More specifically, the rotary motion of an object can be measured by detecting the change in frequency of the electric current flowing through the laser arranged on the object, the voltage applied to the laser or the impedance of the laser. For the purpose of the invention, the change at one of the discharging electrodes, which may be the anode, of the ring resonator type gas laser of a gyro is detected.

Now, an optical gyro and a method of operating the same according to the invention will be described below along with its configuration by referring to the accompanying drawings that illustrate preferred embodiments of the invention.

Embodiment 1

FIG. 1 is a schematic plan view of an embodiment of optical gyro comprising a ring resonator type gas laser with laser beams propagating circuitally in opposite directions, where a rectangular circuital path is used for the laser beams. Referring to FIG. 1, there are shown an electric terminal 1, a quartz tube 10 prepared by hollowing a piece of quartz, a mirror 11 and discharging electrodes 21 and 22, of which the electrode 21 may operate as anode and electrode 22 may operate as cathode. Reference numeral 31 denotes a laser beam propagating clockwise, whereas reference numeral 32 denotes a laser beam propagating counterclockwise.

Then, the embodiment starts electrically discharging to give rise to an electric current as helium gas and neon gas are put into the quartz tube 10 of the embodiment of optical gyro and a voltage is applied between the anode 21 and the cathode 22. The oscillation frequency of the laser beam propagating clockwise and that of the laser beam propagating counterclockwise are equal to each other so long as the quartz tube 10 is in a halted state, when the oscillation frequency and the oscillation wavelength of the laser beams are $4.73 \times 10^{14}$ Hz and 632.8 nm, respectively. If the quartz tube 10 that operates as a resonator is driven to rotate at a rate of 180° per second and each of its sides has a length of 10 cm, the beat frequency will be 496.5 kHz. If the supply current is adjusted to show a constant level and the terminal voltage is monitored from the electric terminal 1, a signal with an amplitude of 100 mV and a frequency of 496.5 kHz will be obtained.

Figure 2:
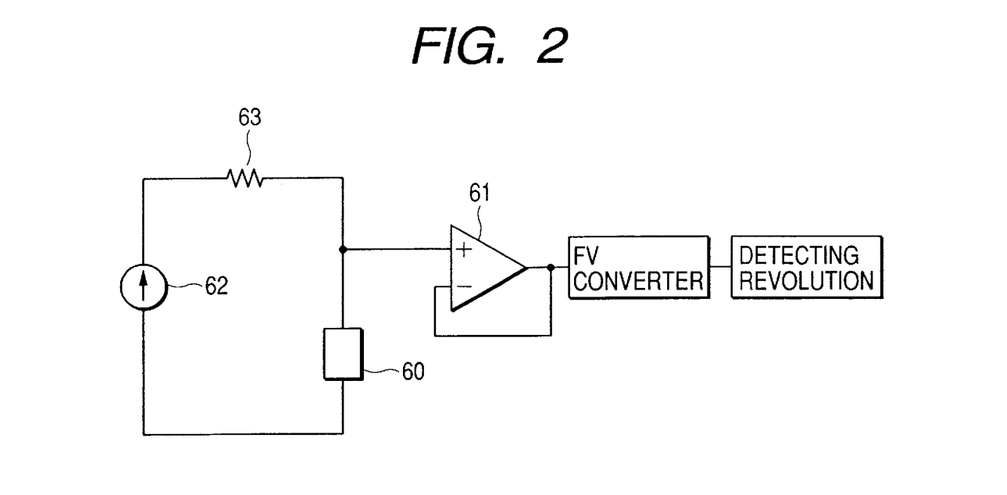
FIG. 2. is a circuit diagram of a circuit that can be used for detecting the beat signal produced by the rotation of the ring resonator type gas laser of a gyro according to the invention, illustrating a method of detecting the beat signal.

For a particular arrangement, the anode of the ring resonator type gas laser 60 is connected to an operational amplifier 61 as shown in FIG. 2. Since the signal output from the amplifier 61 has a frequency corresponding to the angular velocity, it is transformed into a voltage by a known frequency/voltage converter (FV converter) to detect the revolution of the quartz tube 10.

It may be needless to say that the operational amplifier 61 (voltage follower) may be omitted if the embodiment shows desired characteristics without it.

Figure 3:
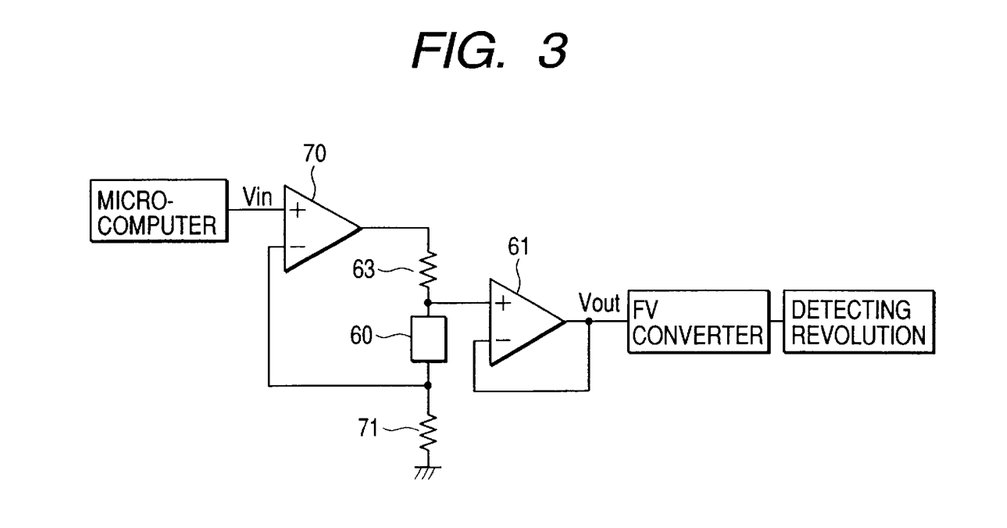
FIG. 3 is a circuit diagram of another circuit that can be used for detecting the beat signal produced by the rotation of the ring resonator type gas laser gyro according to the invention, illustrating a method of detecting the beat signal.

FIG. 3 is a circuit diagram of a circuit designed to drive a laser 60 with a constant current, read the change in the anode voltage of the laser 60, and detect the revolution of the quartz tube of the related quartz tube.

The anode of the laser 60 is connected to the output terminal of operational amplifier 70 by way of a protective resistor 63 and the cathode of the laser 60 is connected to the inverting input terminal of the operational amplifier 70.

Resistor 71 is connected between the inverting input terminal of the operational amplifier 70 and an earth.

When a constant voltage (Vin) is applied to the non-inverting input terminal of the operational amplifier 70 from, for example, a microcomputer, the electric current defined by the voltage and the resistance of the resistor 71 flows to drive the laser with the constant value. The anode of the laser 60 is connected to the operational amplifier 61. The operational amplifier 61 outputs signal Vout having a beat frequency proportional to the angular velocity of the quartz tube, whose frequency is then transformed into a voltage by means of a known frequency/voltage converter (FV converter) so that the revolution of the quartz tube may be detected.

A frequency counter may be used as means for detecting a beat signal.

Figure 4:
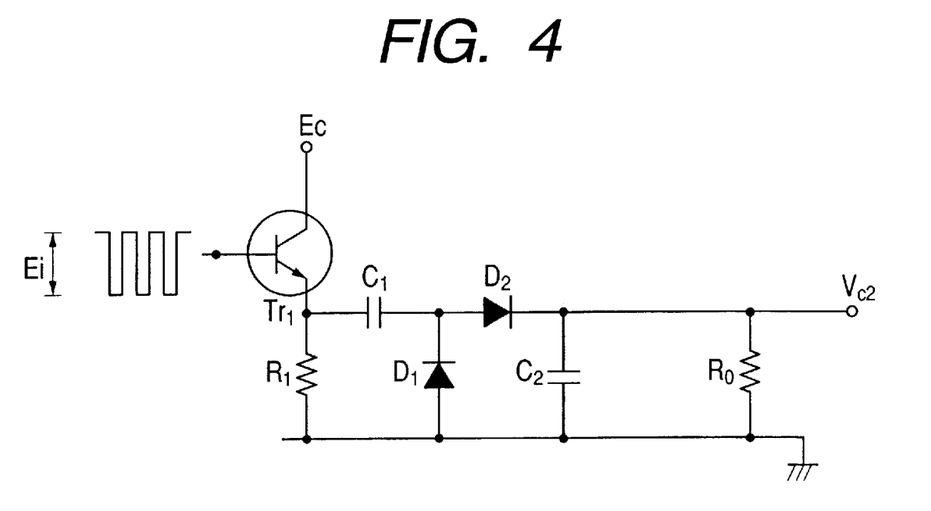
FIG. 4 is a schematic circuit diagram of an FV converter that can be used for the purpose of the invention.

FIG. 4 is a schematic circuit diagram of a frequency/voltage converter (FV converter). The converter comprises a transistor, diodes, capacitors and resistors and its output voltage $V_{c2}$ is expressed by formula (2) below;

$$V_{c2}=E_iC_1R_0f/[1+1/\{1-\exp(-1/R_0C_2f)\}] \quad (2),$$

where $E_i$ is the peak-to-peak value of the input voltage and f is the beat frequency. By selecting circuit parameters that make $C_2>>C_1$ and $R_0C_2f<1$, the formula (2) is reduced to formula (3) below;

$$V_{c2}\approx E_iC_1R_0f/2 \quad (3),$$

so that it is now possible to obtain a voltage output that is proportional to the beat frequency.

It may be needless to say that the change in the electric current flowing to the terminal can be detected in a constant voltage drive mode. While the change in the terminal voltage is detected in the above description, it may alternatively be so arranged for the purpose of the invention that the change in the discharge impedance is directly detected by means of an impedance meter. Generally, in a gyro using a gas laser, the resonator inevitably has a large length to make the gyro dimensionally large because the optical gain of a gas laser is rather small. However, a gyro according to the invention can be made to show small dimensions because it does not need a photodetector.

With the above described arrangement of the invention, the use of a photodetector that is indispensable for detecting a beat signal is no longer required to eliminate any noise due to reflected beams from a photodetector.

While the above described optical gyro uses helium gas and neon gas, any other gases may be used for the purpose of the invention so long as they are adapted for laser oscillation and can detect the desired angular velocity of the quartz tube of the gyro. Examples of gas lasers that can be used for the purpose of the present invention include the argon ion laser, the carbon dioxide gas laser and the excimer laser.

While a quartz tube is used for preparing a gas laser in the above description, a polymer tube may alternatively be used for the purpose of the invention. Then, it may be prepared by a low temperature process. Polymeric materials that can be used for the purpose of the invention include fluorinated polyimides, polysiloxanes, PMMA (polymethylmethacrylate), epoxy resins and polycarbonates. The discharge electrodes are typically made of aluminum, zirconium or tungsten.

As the optical gyro having a configuration as described above is driven to rotate, the oscillation frequency of the laser beam propagating clockwise and that of the laser beam propagating counterclockwise come to show a difference $\Delta f$ that is expressed by formula (1) above. However, so long as the frequency difference $\Delta f$ is small, it will be reduced to nil, or $\Delta f=0$, because the two laser beams are strongly coupled due to the non-linearity of the laser medium. This is a phenomenon referred to as lock-in. This lock-in phenomenon is desirably be avoided by holding the optical gyro in a state where the frequency difference $\Delta f$ between the two oscillation frequencies constantly fluctuates. Conventionally, the lock-in phenomenon is avoided by means of a dithering technique, which has an effect of modulating the angular velocity $\Omega$ in formula (1) above. In a gas laser, the value of Q of the resonator can be fluctuated by modulating the electric current or the voltage in order to fluctuate the oscillation frequency. This is because the oscillation frequency of the gas laser is determined by the Q value of resonance transition of atoms, molecules or ions and that of the resonator and this effect is referred to as that of "the oscillation frequency pulling". Thus, $\lambda$ in formula (1) can be modulated to make it possible to produce a state where $\Delta f$ always fluctuates. Then, the lock-in phenomenon can be avoided without adversely affecting the signal by modulating the laser oscillation frequency in a frequency, which is different from that of the beat signal.

Additionally, the direction of vibration and the level of the terminal voltage can be made to correspond to each other by applying a vibration to a gyro comprising a ring resonator type laser with a frequency, which is different from that of the beat signal and detecting the signal from the terminal in synchronism with the vibration. For instance, when a vibration is applied clockwise to the gyro, the beat frequency of the terminal voltage will be raised if the optical gyro is driven to turn clockwise whereas the beat frequency of the terminal voltage will be lowered if the optical gyro is driven to turn counterclockwise. Thus, it is possible to detect if the optical gyro is turning clockwise or counterclockwise by utilizing this technique without adversely affecting the signal by vibrating the laser in a frequency, which is different from that of the beat signal.

For example, the gas laser of an optical gyro can be made to turn clockwise and counterclockwise by applying a voltage with a frequency of 20 kHz to a piezoelectric element arranged close to the gas laser for the purpose of dithering. Then, a clockwise turn and a counterclockwise turn can be discriminated from each other by detecting a signal synchronized with the voltage applied to the piezoelectric element from terminal 1. For instance, the beat frequency of the terminal voltage will be raised if the gas laser is driven to turn clockwise when an oscillation is applied clockwise. To the contrary, the beat frequency of the terminal voltage will be lowered if the gas laser is driven to turn counterclockwise when an oscillation is applied clockwise. Additionally, it is possible to detect if the gas laser is turning clockwise or counterclockwise without adversely affecting the signal by vibrating the laser in a frequency, which is different from that of the beat signal.

Figure 5:
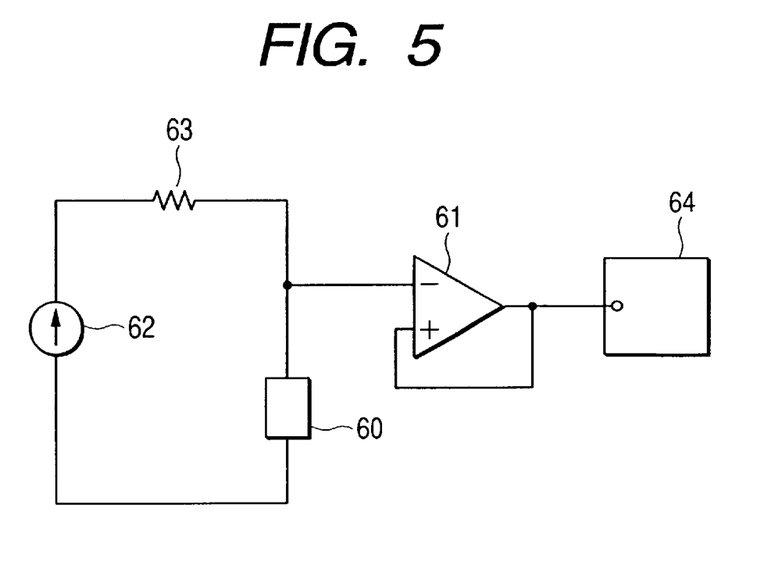
FIG. 5 is a circuit diagram of still another circuit that can be used for detecting the beat signal produced by the rotation of the ring resonator type gas laser of a gyro according to the invention, illustrating a method of detecting the beat signal.

Whenever necessary, possible degradation and destruction of a ring resonator type gas laser 60 can be prevented by arranging a protective circuit 61 at the detection terminal of the gas laser. FIG. 5 shows a circuit using a voltage follower 61 as a protective circuit. In FIG. 5, reference numeral 62 denotes a current source and reference numeral 63 denotes a resistor, whereas reference numeral 64 denotes a voltage detector.

Figure 6:
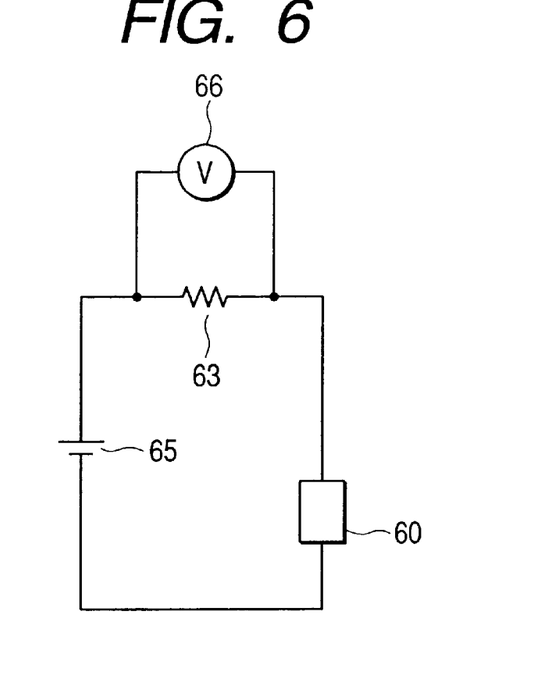
FIG. 6 is a circuit diagram of still another circuit that can be used for detecting the beat signal produced by the rotation of the ring resonator type gas laser of a gyro according to the invention, illustrating a method of detecting the beat signal.
Figure 7:
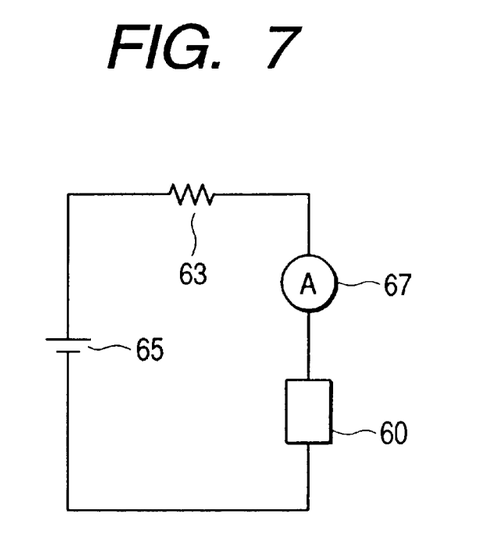
FIG. 7 is a circuit diagram of still another circuit that can be used for detecting the beat signal produced by the rotation of the ring resonator type gas laser of a gyro according to the invention, illustrating a method of detecting the beat signal.

The angular velocity of revolution can be detected as the change in the electric current flowing to the ring resonator type gas laser by using a constant voltage source for supplying power. A lightweight and downsized drive system can be realized by using a battery 65 for the constant voltage source as shown in FIGS. 6 and 7. In FIG. 6, a resistor 63 is connected in series to the ring resonator type gas laser 60 and the electric current flowing to the ring resonator type gas laser is observed by way of the change in the voltage being applied to the opposite ends of the resistor 63. In FIG. 7, on the other hand, an ammeter is connected in series to the ring resonator type gas laser to directly observe the electric current flowing to the ring resonator type gas laser. Note that reference numerals 66 and 67 in FIGS. 6 and 7 denote a voltmeter and an ammeter, respectively. The obtained signal may be subjected to an FV conversion or a frequency/angular velocity (F$\omega$) conversion.

Figure 8:
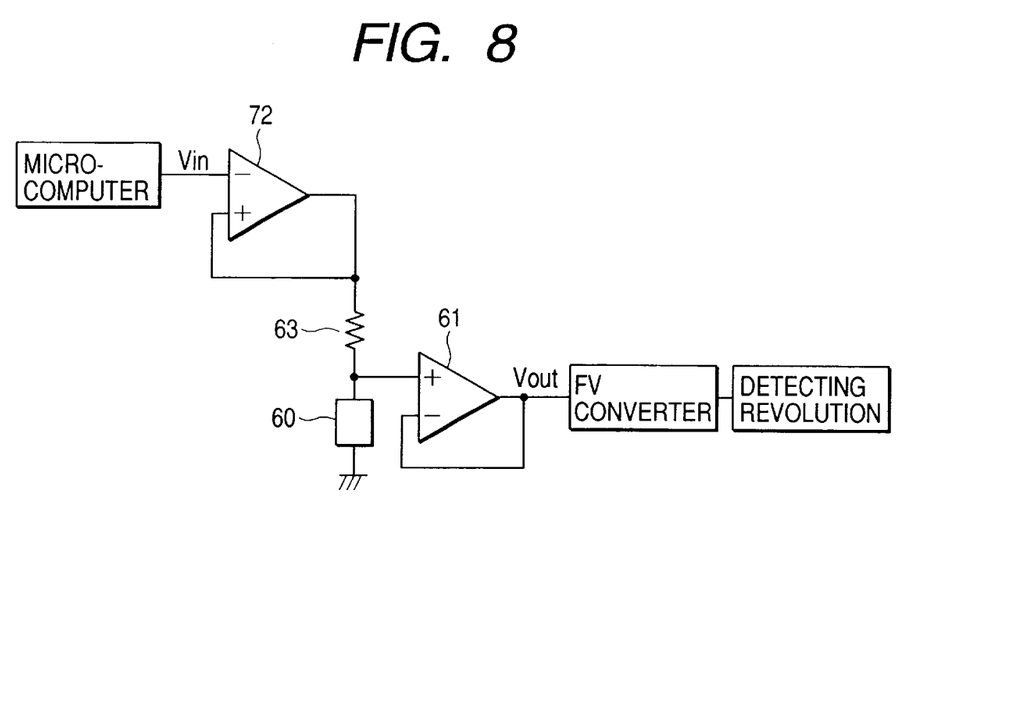
FIGS. 8 and 9 are also circuit diagrams of still other circuits that can be used for detecting the beat signal produced by the rotation of the ring resonator type gas laser of a gyro according to the invention, illustrating a method of detecting the beat signal.

FIG. 8 is a circuit diagram of a circuit for detecting the revolutions per unit time of a gas laser by driving the laser 60 with a constant voltage and reading the change in the anode voltage of the laser. The anode of the laser 60 is connected to the output terminal of an operational amplifier 72 by way of a resistor 63 and the cathode of the laser 60 is grounded to provide a reference voltage.

When a constant voltage Vin is applied to the inverting input terminal of the operational amplifier 72 from a microcomputer, the constant voltage is applied to the resistor 63 and the laser 60 to realize a constant voltage drive arrangement.

The anode of the laser 60 is connected to the operational amplifier 61. The operational amplifier 61 outputs signal Vout. Since this signal has a beat frequency that is proportional to the angular velocity, it is transformed into a voltage by means of a known frequency/voltage converter (FV converter) to detect the revolutions per unit time. It may be needless to say that the revolutions per unit time can also be detected by directly connecting the FV converter to the anode.

Figure 11:
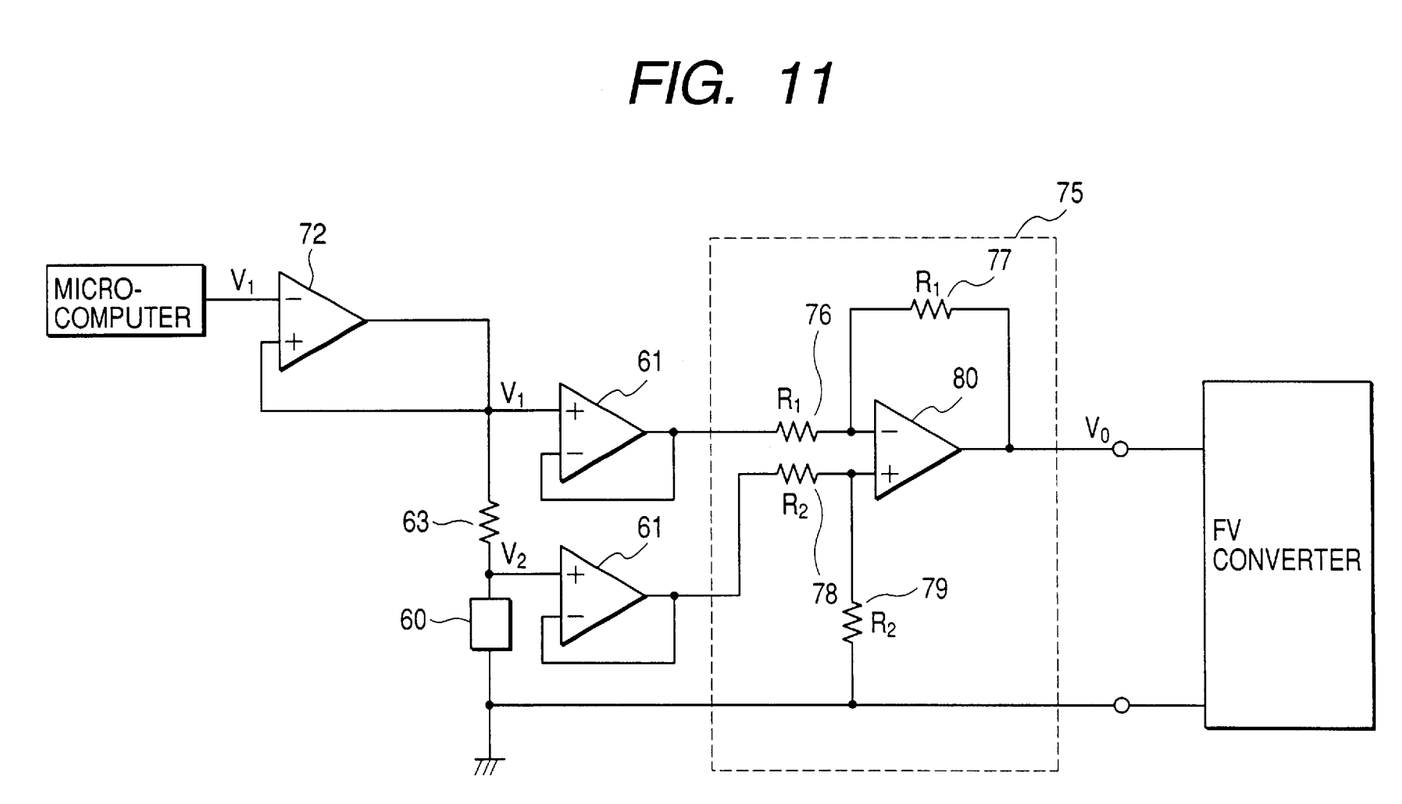
FIG. 11 is a circuit diagram of a still further circuit that can be used for detecting the beat signal produced by the rotation of the ring resonator type gas laser of a gyro according to the invention, illustrating a method of detecting the beat signal.

FIG. 11 is a circuit diagram of a circuit realizing by adding a subtractor 75 to a constant voltage drive arrangement similar to that of FIG. 8 in order to use the voltage across the resistor 63 as a signal.

With this arrangement, a constant potential $V_1$ is applied to the inverting input terminal of the operational amplifier 72 from a microcomputer. In FIG. 11, reference numerals 60 and 61 denote a ring resonator type gas laser and voltage followers, respectively and reference numerals 63 and 76 through 79 denote respective resistors. The resistors 76 and 77 as well as 78 and 79 show equal resistance values, respectively.

The voltages $V_1$, $V_2$ of the opposite ends of the resistor 63 are applied respectively to the inverting input terminal and the non-inverting input terminal of the amplifier 80 by way of the respective voltage followers 61 and the respective resistors 76 and 78. With this arrangement, the change in the voltage $V_2-V_1$ ($V_0$) applied to the resistor 63 can be detected. Therefore, the change in the electric current flowing to the ring resonator type gas laser 60 can be detected.

The obtained signal is then transferred to an FV converter to detect the revolutions per unit time of the gas laser.

Figure 9:
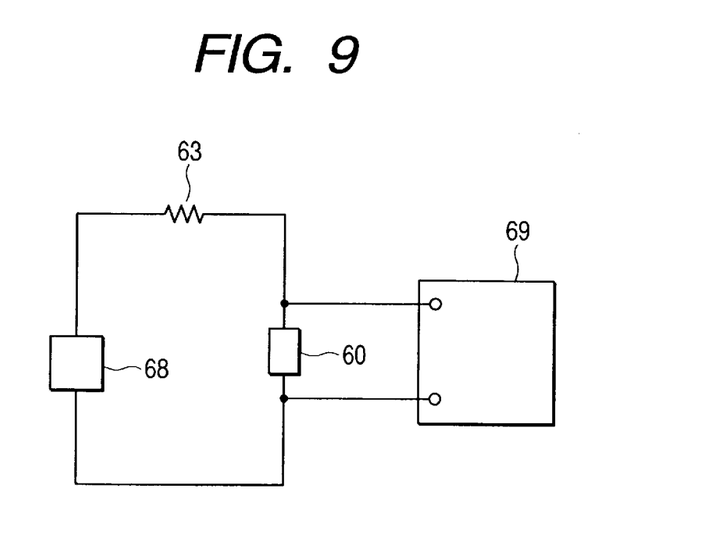

It is also possible to observe the change in the impedance of a ring resonator type gas laser directly by means of an impedance meter regardless of the type of constant current. With this arrangement, the influence of the driving power source noise can be minimized unlike the arrangement of observing the voltage of a terminal or the electric current flowing to an element. FIG. 9 is a circuit diagram of such a circuit arrangement. In FIG. 9, reference numerals 68 and 69 denote a power source and an impedance meter, respectively.

The mirror loss can be reduced by providing the optical gyro with a total internal reflection plane for each corner at the ring resonator type laser. With this arrangement, the oscillation threshold value of the laser can be reduced.

Such a total internal reflection plane is preferably located not within the reach of the evanescent light generated from the ring resonator type laser.

So long as no reflector is present within the reach of the evanescent light generated from the ring resonator type laser, the laser will be optically isolated from any other reflectors to become free from the influence of the outside and the loss attributable to external factors. Additionally, there will be no noise due to the reflected beam. Thus, the coupling loss and the noise due to the reflected beam can be remarkably reduced with this arrangement.

A gyro according to the invention as described above by referring to a preferred embodiment thereof can be mounted on an automobile or an aeroplane and used as an angular velocity detecting unit which is downsized as compared with the conventional one.

Embodiment 2

Figure 10:
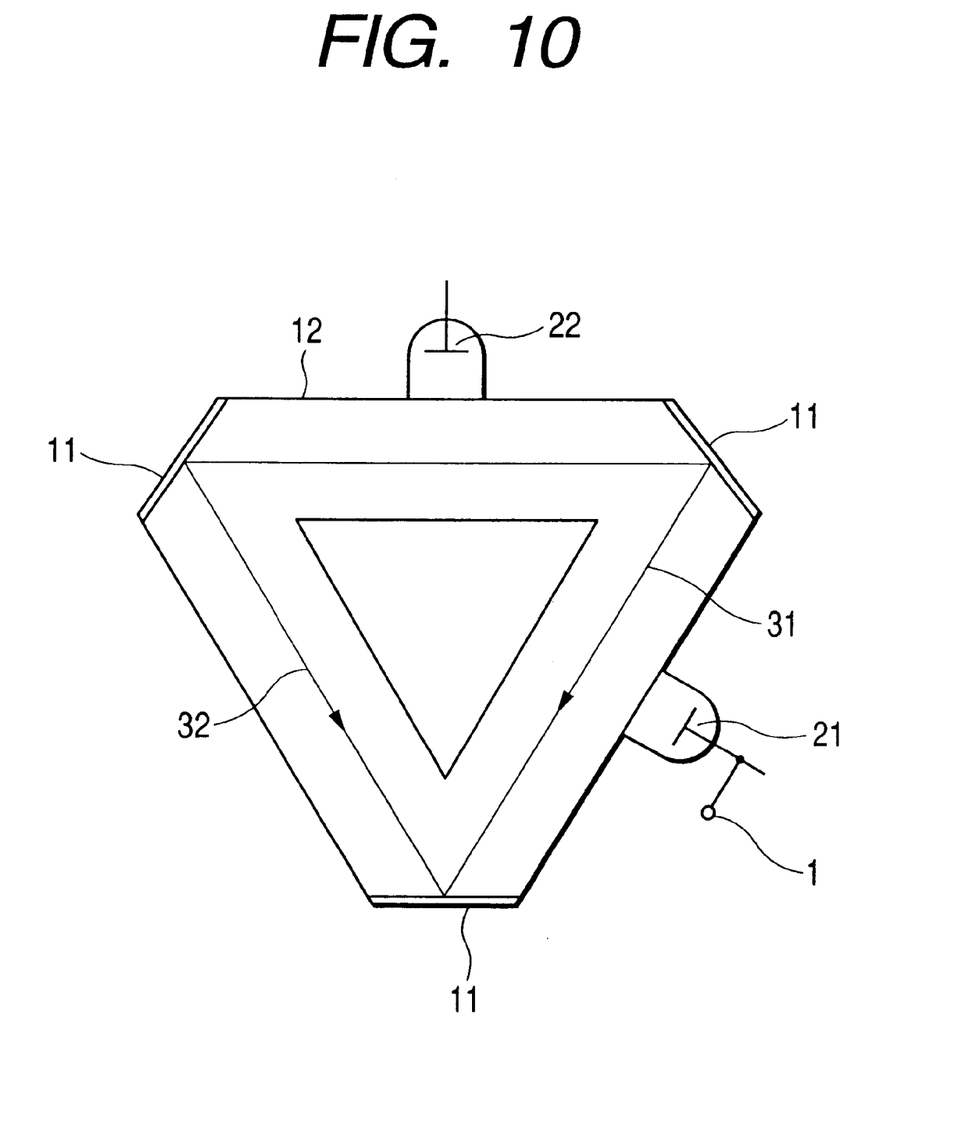
FIG. 10 is a schematic plan view of another embodiment of gyro according to the invention.

FIG. 10 is a schematic plan view of another embodiment of optical gyro comprising a ring resonator type laser with laser beams propagating circuitally in opposite directions, where a triangular circuital path is used for the laser beams. Otherwise, this embodiment is identical with the first embodiment illustrated in FIG. 1.

With this arrangement again, the revolutions per unit time of the gyro can be detected on the principle described above by referring to the first embodiment. In other words, the effects and the advantages of the first embodiment can be obtained regardless of the shape of the circuital path along which the two laser beams are transmitted so long as the laser beam circuitally transmitted clockwise and the laser beam circuitally transmitted counterclockwise follow the same path in opposite directions.

As described above in detail, since a gyro according to the invention is adapted to detect the change in the electric current, the voltage or the impedance attributable to the beat generated by the interference of the laser beams generated in the ring resonator type gas laser and transmitted circuitally in opposite directions, the beat signal can be detected as a function of the revolutions per unit time of the gyro. Thus, the present invention provides an optical gyro that operates without a photodetector or an optical system for optical coupling that is indispensable to conventional optical gyros.

Additionally, the mirror loss can be eliminated to lower the oscillation threshold level of the ring resonator type gas laser by providing a total internal reflection mirror for laser beams inside the gas laser.

Still additionally, when no total reflection plane is present within the reach of the evanescent light generated from the ring resonator type laser, the gas laser will be optically isolated from any other reflectors to become free from the influence of the outside and the loss attributable to external factors. Furthermore, there will be no noise due to the reflected beam. Thus, the coupling loss and the noise due to the reflected beam can be remarkably reduced with this arrangement.

With a method of operating an optical gyro according to the invention, the change in the electric current, the voltage or the impedance detected at the terminal is used as signal for determining the angular velocity of the ring resonator type gas laser to eliminate the use of a photodetector and an optical system for optical coupling that is indispensable for conventional optical gyros so that the present invention can dissolve the problem of coupling loss and that of the noise caused by the reflected beams that are attributable to such components.

Additionally, the lock-in phenomenon that arises from the non-linearity of the laser medium can be avoided by modulating the frequency of the voltage or the electric current for driving the ring resonator type gas laser to a frequency in a frequency band different from that of the beat signal frequency.

Finally, the revolution of an optical gyro comprising a ring resonator type gas laser can be detected easily without adversely affecting the signal by modulating a voltage or an electric current with a frequency in a frequency band different from that of the signal frequency and detecting the signal from the terminal synchronously with the modulation frequency.

What is claimed is:

1. A gyro, comprising:
   a ring resonator type gas laser with laser beams propagating circuitally in opposite directions relative to each other; and beat signal detecting means for detecting a beat signal, wherein
the beat signal is detected as a change in the electric current flowing through, the voltage applied to, or the impedance of said ring resonator type gas laser.

2. A gyro according to claim 1, wherein the beat signal is detected as a change in frequency of the electric current flowing through, the voltage applied to, or the impedance of the ring resonator type laser.

3. A gyro according to claim 1, wherein said ring resonator type gas laser has a terminal for detecting the beat signal as a change in electric current, voltage, or impedance.

4. A gyro according to claim 1, wherein the beat signal is taken out from discharging electrodes of said ring resonator type gas laser.

5. An airplane or an automobile mounted with a gyro according to claim 1.

6. A gyro according to claim 1, wherein the electric current or the voltage for driving said ring resonator type gas laser is modulated in a frequency, which is different from that of the beat signal.

7. A gyro according to claim 1, wherein the beat signal is detected synchronously with a vibration, which is applied to said ring resonator type gas laser and has a frequency different from that of the beat signal.

8. A gyro according to claim 1, wherein said ring resonator type gas laser is helium/neon gas laser, argon ion gas laser or carbon dioxide gas laser.

9. A gyro according to claim 1, wherein said ring resonator type laser is triangular or rectangular.

10. A gyro according to claim 1, wherein said ring resonator type gas laser is provided at a lateral side thereof with a total internal reflection plane.

* * * * *

UNITED STATES PATENT AND TRADEMARK OFFICE
CERTIFICATE OF CORRECTION

PATENT NO.    : 6,297,883 B1
DATED         : October 2, 2001
INVENTOR(S)   : Takahiro Numai Page 1 of 1

It is certified that error appears in the above-identified patent and that said Letters Patent is hereby corrected as shown below:

Column 1,
Line 26, "raser" should read -- laser --.

Column 2,
Line 10, "meaps." should read -- means. --.
Line 11, "beatsignal" should read -- beat signal --.

Signed and Sealed this

Thirtieth Day of April, 2002

Attest:

Attesting Officer

JAMES E. ROGAN
*Director of the United States Patent and Trademark Office*